(12) United States Patent
Lee

(10) Patent No.: US 7,312,113 B2
(45) Date of Patent: Dec. 25, 2007

(54) METHOD OF FORMING SOURCE/DRAIN REGION OF SEMICONDUCTOR DEVICE

(75) Inventor: Dong Ho Lee, Kyoungki-do (KR)

(73) Assignee: Hynix Semiconductors Inc., Icheon-Si (KR)

( * ) Notice: Subject to any disclaimer, the term of this patent is extended or adjusted under 35 U.S.C. 154(b) by 0 days.

(21) Appl. No.: 11/399,877

(22) Filed: Apr. 7, 2006

(65) Prior Publication Data

US 2006/0228849 A1 Oct. 12, 2006

(30) Foreign Application Priority Data

Apr. 11, 2005 (KR) ...................... 10-2005-0030044

(51) Int. Cl.
*H01L 21/8238* (2006.01)

(52) U.S. Cl. ...................... 438/199; 438/231

(58) Field of Classification Search ................ 438/199, 438/231
See application file for complete search history.

(56) References Cited

U.S. PATENT DOCUMENTS

| | | | | |
|---|---|---|---|---|
| 5,296,401 A | * | 3/1994 | Mitsui et al. ................ | 438/231 |
| 5,773,199 A | * | 6/1998 | Linliu et al. ................. | 430/316 |
| 5,795,801 A | * | 8/1998 | Lee ............................. | 438/199 |
| 6,066,563 A | * | 5/2000 | Nagashima .................. | 438/692 |
| 6,090,652 A | * | 7/2000 | Kim ............................ | 438/228 |
| 2001/0034093 A1 | * | 10/2001 | Matsuzaki et al. .......... | 438/199 |
| 2005/0253173 A1 | * | 11/2005 | Wang et al. ................. | 257/282 |

FOREIGN PATENT DOCUMENTS

| | | |
|---|---|---|
| JP | 10-173172 A | 6/1998 |
| KR | 100214468 B1 | 5/1999 |
| KR | 10-2002-0095911 A | 12/2002 |
| KR | 10-2005-0005162 A | 1/2005 |

* cited by examiner

*Primary Examiner*—Kevin M. Picardat
*Assistant Examiner*—Neil Prasad
(74) *Attorney, Agent, or Firm*—Townsend and Townsend and Crew LLP

(57) ABSTRACT

A method of forming a source/drain region of a semiconductor device includes forming a photoresist pattern through which an NMOS region of a semiconductor substrate is exposed, and then performing an ion implant process to form NMOS LDD regions in the semiconductor substrate of the NMOS region. An ion implant process is performed to form PMOS pocket regions in a PMOS region of the semiconductor substrate. Spacers are formed on sidewalls of a PMOS gate electrode pattern and sidewalls of an NMOS gate electrode pattern, and an ion implant process is performed to form PMOS source/drain regions in the semiconductor substrate in which the PMOS pocket regions are formed. An ion implant process is performed to form NMOS source/drain regions in the semiconductor substrate in which the NMOS LDD regions are formed.

11 Claims, 3 Drawing Sheets

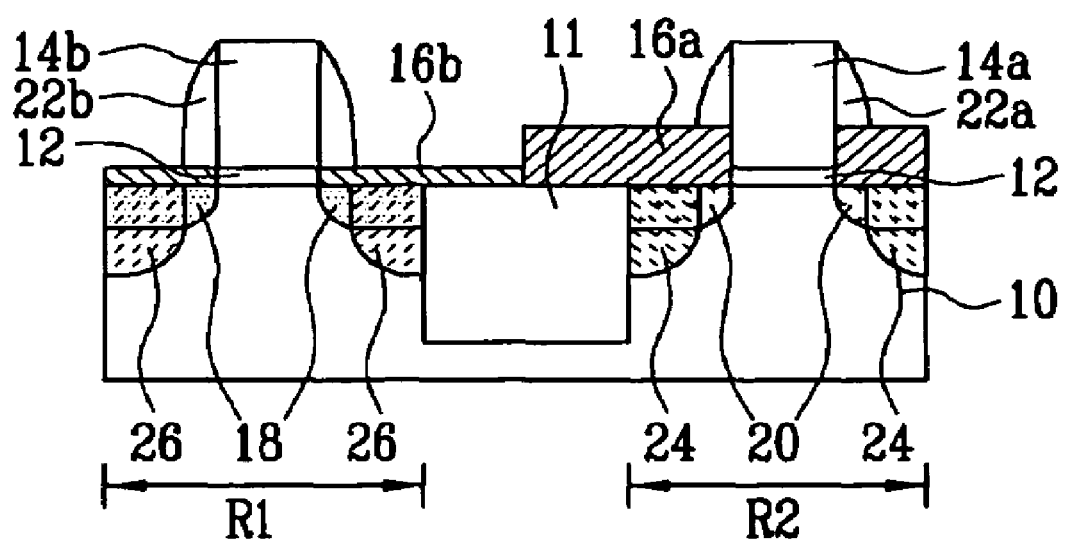

METHOD OF FORMING SOURCE/DRAIN REGION OF SEMICONDUCTOR DEVICE

BACKGROUND

The present invention relates to a method of fabricating semiconductor devices. More particularly, the present invention relates to a method of forming a source/drain region of a semiconductor device.

In the source/drain region formation process of the semiconductor device, an ion implant barrier insulation film defined as a screen insulation film functioning to protect a semiconductor substrate is deposited on the semiconductor substrate. An ion implant process for forming the source/drain region is then performed.

If the ion implant barrier insulation films having the same thickness are formed on the semiconductor substrate in which a PMOS region and a NMOS region are defined and the ion implant process is then performed on each region to form the source/drain region, however, a problem arises because it is difficult to form a source/drain region suitable for the property of each of the PMOS region and the NMOS region.

SUMMARY OF THE INVENTION

The present invention relates to a method of forming a source/drain region of a semiconductor device, wherein a source/drain region suitable for the property of each of a PMOS region and an NMOS region can be formed.

A method of forming a source/drain region of a semiconductor device according to an embodiment of the present invention includes providing a semiconductor substrate in which a PMOS region including a PMOS gate electrode pattern and an NMOS region including an NMOS gate electrode pattern are defined. A first ion implant barrier insulation film is formed on the entire surface of the semiconductor substrate. A photoresist pattern is then formed through which the NMOS region is exposed, and an ion implant process is performed to form NMOS LDD regions in the semiconductor substrate of the NMOS region. The first ion implant barrier insulation film of the NMOS region is stripped to a predetermined thickness while the photoresist pattern is stripped by performing a strip process for stripping the photoresist pattern, thereby forming a second ion implant barrier insulation film. The PMOS region is exposed, and then an ion implant process is performed to form PMOS pocket regions in the semiconductor substrate of the PMOS region. Spacers are formed on sidewalls of the PMOS gate electrode pattern and sidewalls of the NMOS gate electrode pattern. The PMOS region is then exposed over locations in which the PMOS gate electrode pattern including the spacers is formed, and then an ion implant process is performed to form PMOS source/drain regions in the semiconductor substrate in which the PMOS pocket regions are formed. The NMOS region is exposed over locations in which the NMOS gate electrode pattern including the spacers is formed, and an ion implant process is performed to form NMOS source/drain regions in the semiconductor substrate in which the NMOS LDD regions are formed.

The first ion implant barrier insulation film may serve as an ion implant barrier insulation film during the ion implant process for forming the PMOS source/drain regions.

The second ion implant barrier insulation film may serve as an ion implant barrier insulation film during the ion implant process for forming the NMOS source/drain regions.

The strip process may be performed using a BOE solution with the ratio of 100:1 for about 90 to 150 seconds.

The first ion implant barrier insulation film may be formed using one of an oxide film, a nitride film, a USG film and a PSG film and may be formed to a thickness of 180 to 220 Å.

The second ion implant barrier insulation film may be formed to a thickness of 45 to 55 Å.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 1 to 7 are cross-sectional views illustrating a method of forming a source/drain region of a semiconductor device according to an embodiment of the present invention.

DETAILED DESCRIPTION OF THE INVENTION

Figure 1:
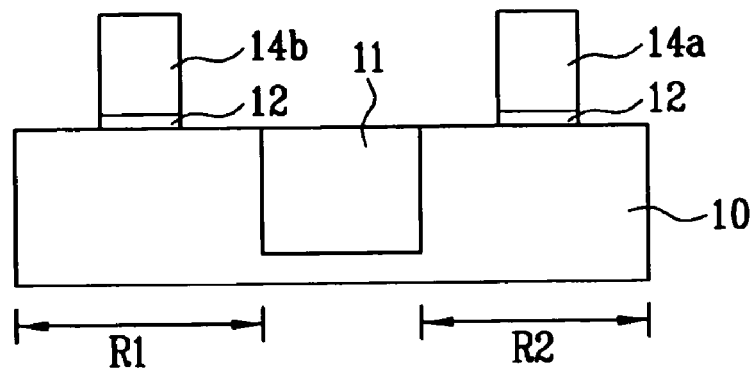

In the following detailed description, only a certain exemplary embodiment of the present invention has been shown and described simply by way of illustration. As those skilled in the art will realize, the described embodiment may be modified in various different ways, all without departing from the spirit or scope of the present invention. Accordingly, the drawings and description are to be regarded as illustrative in nature and not restrictive. Like reference numerals designate like elements throughout.

FIGS. 1 to 7 are cross-sectional views illustrating a method of forming a source/drain region of a semiconductor device according to an embodiment of the present invention.

Referring first to FIG. 1, an isolation film 11 is formed in an inactive region of a semiconductor substrate 10 in which an NMOS region (R1) and a PMOS region (R2) are defined. An NMOS gate electrode pattern 14b, which is isolated from the semiconductor substrate 10 with a gate oxide film 12 intervened therebetween, is formed in the NMOS region (R1). A PMOS gate electrode pattern 14a, which is isolated from the semiconductor substrate 10 with the gate oxide film 12 intervened therebetween, is formed in the PMOS region (R2).

The isolation film 11 may be formed through a Shallow Trench Isolation (STI) process or the like. The gate electrode patterns 14a and 14b may be formed by sequentially forming a gate oxide film and a gate electrode polysilicon film and then patterning them.

Figure 2:
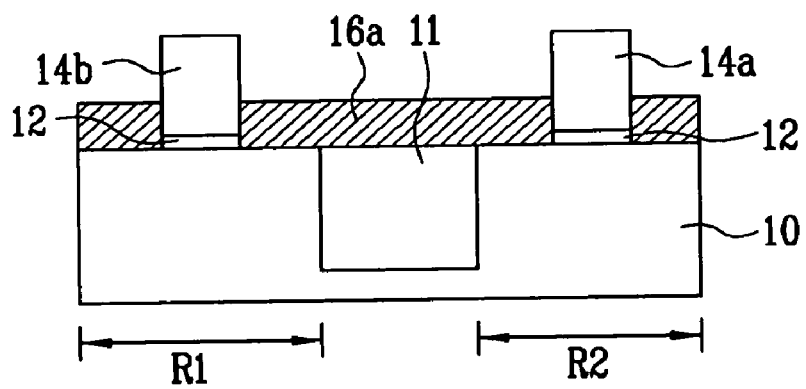

As shown in FIG. 2, a PMOS ion implant barrier insulation film 16a is formed on the resulting surface. In one embodiment of the present invention, the PMOS ion implant barrier insulation film 16a is formed to a thickness of about 180 to 220 Å.

The PMOS ion implant barrier insulation film 16a is the film quality defined as a screen insulation film functioning to protect the semiconductor substrate in an ion implant process that will be performed on the PMOS region. After the PMOS ion implant barrier insulation film 16a is formed both in the PMOS region (R2) and the NMOS region (R1), the PMOS ion implant barrier insulation film 16a having a thickness of about 180 to 220 Å remains in the PMOS region (R2) through a subsequent process. In some embodiments, the PMOS ion implant barrier insulation film 16a may be formed using one of the following: an oxide film, a nitride film, a USG film and a PSG film.

Figure 3:
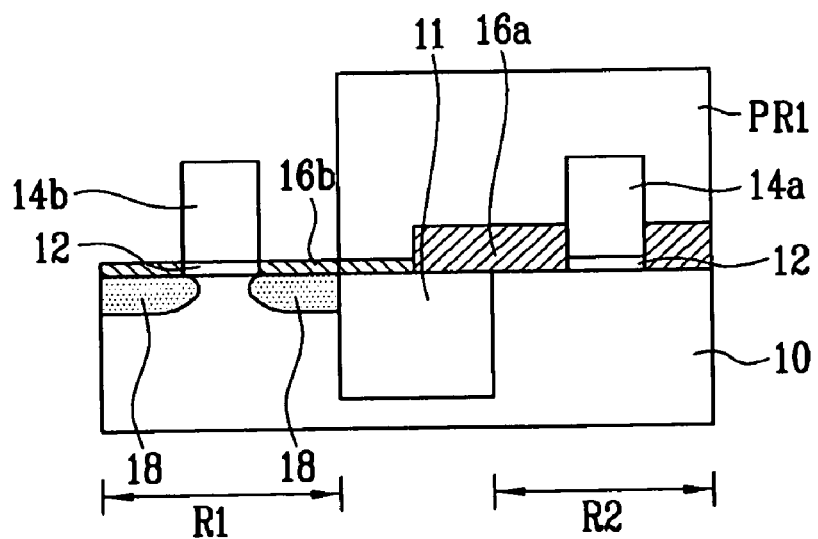

As shown in FIG. 3, a first photoresist pattern PR1 is formed to expose the NMOS region (R1). An ion implant process using the NMOS gate electrode pattern 14b and the first photoresist pattern PR1 as ion implant masks is then performed to form NMOS LDD regions 18 in the semiconductor substrate 10 of the NMOS region (R1).

During the ion implant process for forming the NMOS LDD regions 18, the PMOS ion implant barrier insulation film 16a serves as the screen insulation film.

A strip process for stripping the first photoresist pattern PR1 over locations in which the NMOS LDD regions 18 are formed is then carried out. During the strip process, a predetermined thickness of the PMOS ion implant barrier insulation film 16a formed in the NMOS region (R1) is stripped, thereby forming a NMOS ion implant barrier insulation film 16b in the NMOS region (R1).

The strip process may be performed using a BOE solution with the ratio of 100:1 for about 90 to 150 seconds. Through the strip process, while the formed first photoresist pattern PR1 is stripped, the PMOS ion implant barrier insulation film 16a having a thickness of about 45 to 55 Å remains in the NMOS region (R1) so that the NMOS ion implant barrier insulation film 16b can be formed.

After the strip process is completed, a cleaning process is performed. The cleaning process causes the PMOS ion implant barrier insulation film 16a having a thickness of 45 to 55 Å to be partially etched. In some embodiments, the NMOS ion implant barrier insulation film 16b has a thickness of about 45 to 55 Å.

Figure 4:
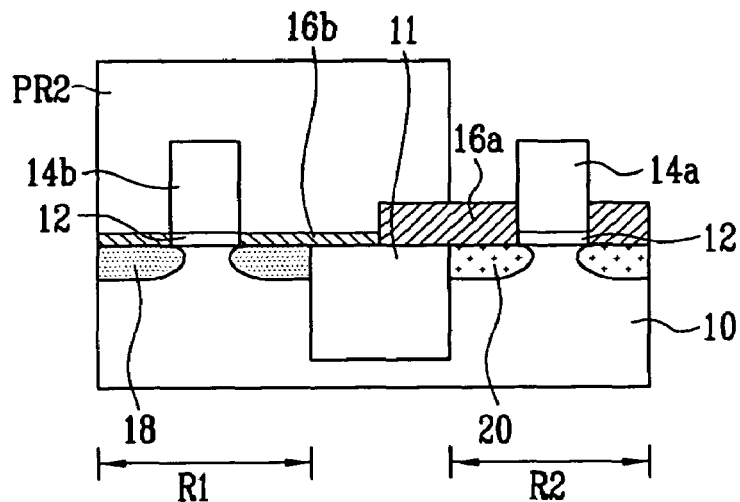

As shown in FIG. 4, a second photoresist pattern PR2 is formed over the PMOS region (R2). An ion implant process using the PMOS gate electrode pattern 14a and the second photoresist pattern PR2 as ion implant masks is then performed to form PMOS pocket regions 20 in the semiconductor substrate 10 of the PMOS region (R2).

In the ion implant process for forming the PMOS pocket regions 20, the PMOS ion implant barrier insulation film 16a serves as the ion implant barrier insulation film in the same manner as the ion implant process for forming NMOS LDD regions 18.

A strip process for stripping the second photoresist pattern PR2 over locations in which the PMOS pocket regions 20 are formed is then implemented. In this case, the strip process is performed without using BOE unlike the formation of the NMOS ion implant barrier insulation film 16b so that the PMOS ion implant barrier insulation film 16a remains in thickness of about 180 to 220 Å.

Figure 5:
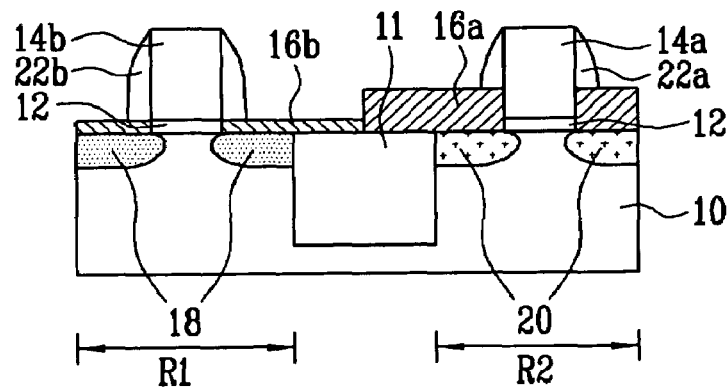

As shown in FIG. 5, spacers 22a, 22b are formed on the sidewalls of the PMOS gate electrode pattern 14a and the NMOS gate electrode pattern 14b, respectively.

Figure 6:
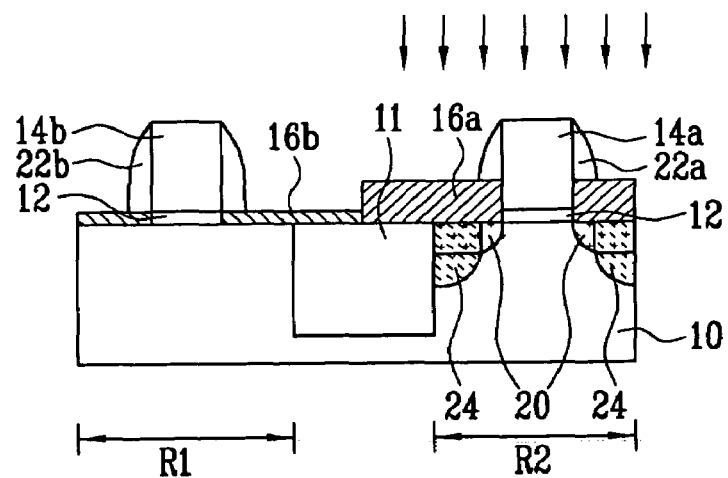

As shown in FIG. 6, a photoresist pattern (not shown) through which the PMOS region (R2) is exposed is formed in the results including the spacers 22a, 22b. An ion implant process using the photoresist pattern (not shown), the PMOS gate electrode pattern 14a and the spacers 22a formed in the gate electrode sidewall as the ion implant masks is then performed to form PMOS source/drain regions 24. Thereafter, a strip process for stripping the photoresist pattern (not shown) is implemented.

In the formation process of the PMOS source/drain regions 24, the PMOS ion implant barrier insulation film 16a serves as the ion implant screen insulation film.

If the formation process of the PMOS source/drain regions 24 is performed in thickness of 45 to 55 Å or less, which is the same thickness as that of the NMOS ion implant barrier insulation film, a channeling phenomenon is generated in the implanted ion. If the PMOS ion implant barrier insulation film 16a is formed only in the PMOS region (R2) and the PMOS source/drain regions formation process is then performed as in an embodiment of the present invention, it can prevent the channeling phenomenon of the implanted ion. Therefore, the present invention is advantageous in the formation of a shallow junction.

The ion implant process for forming the PMOS source/drain regions may be performed using a P type ion such as boron (B).

As shown in FIG. 7, a photoresist pattern is formed (not shown) through which the NMOS region (R1) is exposed. An ion implant process using the photoresist pattern (not shown), the NMOS gate electrode pattern 14b and the spacers 22b formed on the sidewalls of the gate electrodes as the ion implant masks is performed to form NMOS source/drain regions 26. A strip process for stripping the photoresist pattern (not shown) is then performed, thereby completing the present process.

In one embodiment, if the formation process of the NMOS source/drain regions 26 is performed in thickness of 200 Å, which is the same thickness of the PMOS ion implant barrier insulation film 16a, the recoil phenomenon with respect to an implanted ion is increased. If the NMOS ion implant barrier insulation film 16b is formed only in the NMOS region (R1) and the NMOS source/drain regions formation process is then performed as in an embodiment of the present invention, however, the recoil phenomenon with respect to an implanted ion can be reduced.

The ion implant process for forming the NMOS source/drain regions may be performed using an N type ion such as arsenic (As).

As described above, in accordance with an embodiment of the present invention, after an ion implant barrier insulation film having a thickness suitable for each of a NMOS region and a PMOS region is formed, a source/drain region formation process is performed on each region. Accordingly, a source/drain region suitable for the property of each of the PMOS region and the NMOS region can be formed.

While the invention has been described in connection with what is presently considered to be an exemplary embodiment, it is to be understood that the invention is not limited to the disclosed embodiment, but, on the contrary, is intended to cover various modifications and equivalent arrangements included within the spirit and scope of the appended claims.

What is claimed is:

1. A method of forming a source/drain region of a semiconductor device, the method comprising:
providing a semiconductor substrate in which a PMOS region including a first gate electrode pattern having a first gate oxide film and an NMOS region including a second gate electrode pattern having a second gate oxide film are defined;
forming a first ion implant barrier insulation film over the semiconductor substrate in which the first and the second electrode patterns are formed,
forming a photoresist pattern that exposes the NMOS region;

performing a first ion implant process to form NMOS LDD regions in the NMOS region;

performing a first strip process that strips the photoresist pattern and removes the first ion implant barrier insulation film of the NMOS region to a predetermined thickness to form a second ion implant barrier insulation film over the NMOS region;

exposing the PMOS region, and then performing a second ion implant process to form PMOS pocket regions in the PMOS region;

forming spacers on sidewalls of the first gate electrode pattern and sidewalls of the second gate electrode pattern;

forming PMOS source/drain regions in the semiconductor substrate in which the PMOS pocket regions are formed by performing a third ion implant process to the PMOS region on which the first ion implant barrier insulation film is formed; and forming NMOS source/drain regions in the semiconductor substrate in which the NMOS LDD regions are formed by performing a fourth ion implant process to the NMOS region on which the second ion implant barrier insulation film is formed.

2. The method as claimed in claim 1, wherein the first ion implant barrier insulation film serves as an ion implant barrier insulation film during the third ion implant process for forming the PMOS source/drain regions.

3. The method as claimed in claim 1, wherein the second ion implant barrier insulation film serves as an ion implant barrier insulation film during the fourth ion implant process for forming the NMOS source/drain regions.

4. The method as claimed in claim 1, wherein the strip process is performed using a BOE solution with the ratio of 100:1 for about 90 to about 150 seconds.

5. The method as claimed in claim 1, wherein the first ion implant barrier insulation film is formed using one of an oxide film, a nitride film, a USG film, and a PSG film, and is formed to a thickness of about 180 to about 220 Å.

6. The method as claimed in claim 1, wherein the second ion implant barrier insulation film is formed to a thickness of about 45 to about 55 Å.

7. The method as claimed in claim 5, further comprising:

forming a second photoresist pattern through which the PMOS region is exposed before performing the second ion implant process; and performing a second strip process for stripping the second photoresist pattern, wherein the second strip process is performed without using BOE so that the first ion implant barrier insulation film maintains the thickness of about 180 to about 220 Å.

8. The method as claimed in claim 1, wherein the PMOS source/drain regions are formed with a thickness of about 45 to about 55 Å.

9. The method as claimed in claim 1, wherein the NMOS source/drain regions are formed with a thickness of about 200 Å.

10. The method as claimed in claim 1, wherein the third ion implant process to form PMOS source/drain regions is performed using boron (B).

11. The method as claimed in claim 1, wherein the fourth ion implant process to form NMOS source/drain regions is performed using arsenic (As).

* * * * *